US012550785B2

(12) United States Patent
Li et al.

(10) Patent No.: US 12,550,785 B2
(45) Date of Patent: Feb. 10, 2026

(54) SEPARATED INPUT/OUTPUT (I/O) AND SHARED POWER TERMINALS FOR A CARRIER WAFER WITH A BUILT-IN DEVICE FOR BONDING WITH ANOTHER DEVICE WAFER

(71) Applicant: INTERNATIONAL BUSINESS MACHINES CORPORATION, Armonk, NY (US)

(72) Inventors: Tao Li, Slingerlands, NY (US); Ruilong Xie, Niskayuna, NY (US); Chih-Chao Yang, Glenmont, NY (US); Brent A. Anderson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 657 days.

(21) Appl. No.: 17/821,808

(22) Filed: Aug. 24, 2022

(65) Prior Publication Data
US 2024/0072001 A1 Feb. 29, 2024

(51) Int. Cl.
*H01L 25/065* (2023.01)
*H01L 23/00* (2006.01)
(Continued)

(52) U.S. Cl.
CPC ...... *H01L 25/0657* (2013.01); *H01L 23/5286* (2013.01); *H01L 24/05* (2013.01);
(Continued)

(58) Field of Classification Search
CPC ..... H01L 23/5286; H01L 24/05; H01L 24/08; H01L 2224/05571; H01L 2224/05647; H01L 2224/08147; H01L 2224/808; H01L 2225/06527; H01L 2224/08146; H01L 25/0657; H01L 24/80; H01L 25/18; H01L 25/50; H01L 2225/06541
See application file for complete search history.

(56) References Cited

U.S. PATENT DOCUMENTS 10,403,659 B2 9/2019 Gambino et al.
10,636,739 B2 4/2020 Beyne et al.
(Continued)

FOREIGN PATENT DOCUMENTS

CN 112542378 A 3/2021
DE 102021109881 B3 2/2022
EP 4199079 A1 * 6/2023 ......... H01L 23/5286

*Primary Examiner* — Mamadou L Diallo
(74) *Attorney, Agent, or Firm* — CANTOR COLBURN LLP; L. Jeffrey Kelly

(57) ABSTRACT

An integrated circuit (IC) assembly method is provided. The method includes fabricating a first wafer including a first device with a back end of line (BEOL) and first terminals of first and second types at the BEOL and fabricating a second wafer including a second device for back side power delivery network (BSPDN) processing, second terminals of the first type, first vias and second vias. The first and second wafers are bonded at the BEOL to connect the second terminals of the first type to a subset of the first terminals of the first type, the first vias to remaining first terminals of the first type, and the second vias to the first terminals of the second type. A BSPDN is built onto a backside of the second wafer to include first and second BSPDN terminals connected to the first and second vias, respectively.

20 Claims, 4 Drawing Sheets

(51) Int. Cl.
   *H01L 23/528* (2006.01)
   *H01L 25/00* (2006.01)
   *H01L 25/18* (2023.01)
(52) U.S. Cl.
   CPC .............. *H01L 24/08* (2013.01); *H01L 24/80* (2013.01); *H01L 25/18* (2013.01); *H01L 25/50* (2013.01); *H01L 2224/05571* (2013.01); *H01L 2224/05647* (2013.01); *H01L 2224/08147* (2013.01); *H01L 2224/808* (2013.01); *H01L 2225/06527* (2013.01)

(56) References Cited

U.S. PATENT DOCUMENTS

| | | | |
|---|---|---|---|
| 10,985,057 B2 | 4/2021 | Jourdain et al. | |
| 11,270,917 B2 | 3/2022 | Han | |
| 11,302,706 B2 | 4/2022 | Liu et al. | |
| 2014/0175655 A1 | 6/2014 | Chen et al. | |
| 2020/0243486 A1 | 7/2020 | Quader et al. | |
| 2021/0134721 A1 | 5/2021 | Chiang et al. | |
| 2021/0249384 A1* | 8/2021 | Kim | H10D 1/68 |
| 2021/0383874 A1 | 12/2021 | Oh et al. | |
| 2021/0384168 A1* | 12/2021 | Greco | H01L 23/645 |
| 2021/0407942 A1* | 12/2021 | Yu | H01L 24/19 |
| 2022/0045009 A1 | 2/2022 | Oh | |
| 2022/0165669 A1* | 5/2022 | Yu | H01L 24/80 |
| 2022/0165721 A1* | 5/2022 | Lee | H01L 24/16 |
| 2022/0223530 A1 | 7/2022 | Yu et al. | |
| 2023/0275063 A1* | 8/2023 | Hong | H01L 24/08 257/777 |
| 2023/0352369 A1* | 11/2023 | Fountain, Jr. | H01L 23/5286 |
| 2024/0038634 A1* | 2/2024 | Kim | H10D 30/43 |
| 2025/0266415 A1* | 8/2025 | Lee | H10D 86/85 |

* cited by examiner

SEPARATED INPUT/OUTPUT (I/O) AND SHARED POWER TERMINALS FOR A CARRIER WAFER WITH A BUILT-IN DEVICE FOR BONDING WITH ANOTHER DEVICE WAFER

BACKGROUND

The present invention generally relates to fabrication methods and resulting structures for semiconductor devices. More specifically, the present invention relates to a separated input/output (I/O) and shared power terminals for a carrier wafer with a built-in device for bonding with another device wafer with a backside power delivery network (BSPDN).

Semiconductor processing for the fabrication of integrated circuit (IC) chips continues to evolve towards increasing device-density. That is, higher numbers of active devices (mainly transistors) of ever decreasing device dimensions are placed on a given surface of semiconductor material. This has put and continues to place a strain on the design and fabrication of the interconnects between front end of line design layouts of the IC, which mainly include the active devices, and contact terminals of the IC In conventional designs, these interconnects are incorporated in the back end of line (BEOL) of the IC and are provided as a stack of metallization layers on top of the front end with layers of circuitry connected by vertical vias. The power delivery network or PDN is formed by conductors and vias connected to VDD/VSS terminals of the chip, for delivering power to the individual devices in the front end. The integration of this power delivery network in the BEOL has become particularly challenging due in part to the increases in the device density.

SUMMARY

Embodiments of the present invention are directed to an integrated circuit (IC) assembly method. A non-limiting example of the method includes fabricating a first wafer including a first device with a back end of line (BEOL) and first terminals of first and second types at the BEOL and fabricating a second wafer including a second device for back side power delivery network (BSPDN) processing, second terminals of the first type, first vias and second vias. The method further includes bonding the first and second wafers at the BEOL to connect the second terminals of the first type to a subset of the first terminals of the first type, the first vias to remaining first terminals of the first type and the second vias to the first terminals of the second type. The method also includes building a BSPDN onto a backside of the second wafer to include first and second BSPDN terminals connected to the first and second vias, respectively.

Embodiments of the present invention are directed to an integrated circuit (IC). A non-limiting example of the IC includes a first wafer and a second wafer. The first wafer includes a first device with a back end of line (BEOL) and first terminals of first and second types at the BEOL. The second wafer includes a second device for back side power delivery network (BSPDN) processing, second terminals of the first type, first vias and second vias. The second wafer is bonded to the first wafer at the BEOL to connect the second terminals of the first type to a subset of the first terminals of the first type, the first vias to remaining first terminals of the first type and the second vias to the first terminals of the second type. A BSPDN is built onto a backside of the second wafer to include first and second BSPDN terminals connected to the first and second vias, respectively.

Embodiments of the invention are directed to an integrated circuit (IC). A non-limiting example of the IC includes a carrier wafer and a second wafer. The carrier wafer includes at least one or more of a logic device, a memory device and an optical chip device with a back end of line (BEOL), and first input/output (I/O) terminals and first power terminals at the BEOL. The second wafer includes at least one or more of a logic device, a memory device and an optical chip device for back side power delivery network (BSPDN) processing, second I/O terminals, I/O vias and power vias. The second wafer is bonded to the carrier wafer at the BEOL to connect the second I/O terminals to a subset of the first I/O terminals, the I/O vias to remaining first I/O terminals and the power vias to the first power terminals. A BSPDN is built onto a backside of the second wafer to include first and second BSPDN terminals connected to the I/O and the power vias, respectively.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
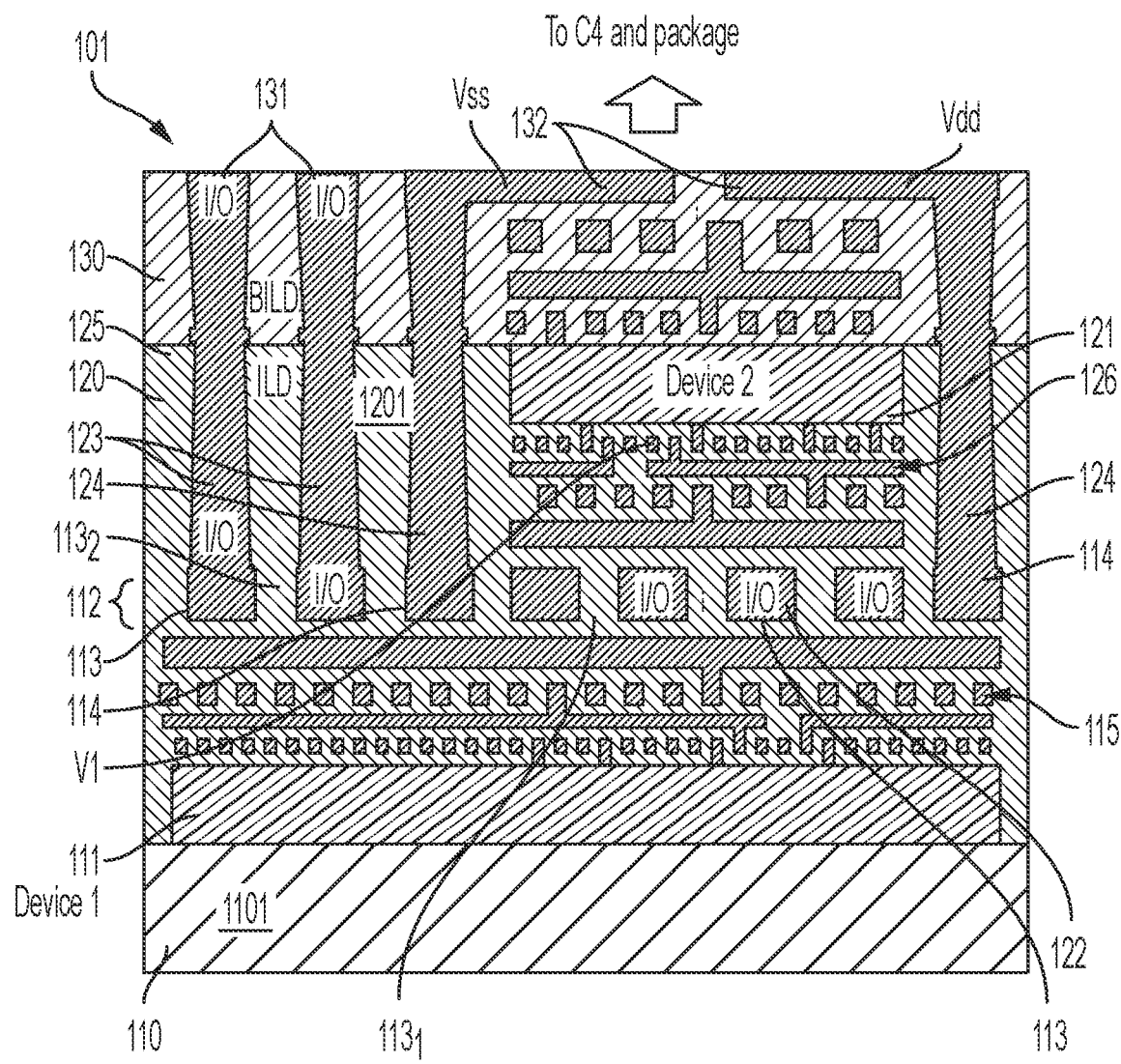
FIG. 1 depicts an integrated circuit (IC) in accordance with one or more embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, a way to integrate a power delivery network in a BEOL with a high degree of device density lies in a production of a majority of layers of the power delivery network on a back side of an IC instead of the front side. These layers are thus not formed on top of the front end of line (FEOL), but on the opposite side of the IC, i.e., on the backside of the semiconductor substrate onto which active devices have been built.

A problem with this solution is that to reach individual active devices in the FEOL, backside power planes are either directly connected to source and drain areas of the active devices or to the M1 layer in the BEOL, or to both. Using M1 for the power supply still means that an important part of the BEOL is used for power delivery and directly connecting source and drain areas from the back is difficult in view of the continuous scaling down of active device sizes. For non-planar active devices, such as finFET transistors, directly contacting the source/drain from the back by a substrate via is even more difficult.

Thus, an IC has been proposed in which a power delivery network is fully separated from the BEOL, without requiring direct contacts with source and drain areas from the back side. The IC includes a FEOL portion including active devices, a pre-metal dielectric layer on top of the front end of line portion, a BEOL portion on top of the pre-metal dielectric layer, one or more power terminals and one or more reference terminals, and a power delivery network (PDN) connecting a plurality of the active devices to the terminals. The FEOL portion includes a plurality of interconnect rails, including at least one power rail and at least one reference rail. The plurality of active devices are each connected to the at least one power and reference rail through local interconnects which are at least partially embedded in the pre-metal dielectric layer. The power delivery network is entirely located underneath the FEOL portion, and the power delivery network connects the power and reference rails respectively to the power and reference terminals.

In the proposed IC, both the active devices and the interconnect rails are part of the front end of line portion of the IC, and are therefore substantially at the same level (i.e., interconnect rails are adjacent to active devices). A local interconnect is therefore a lateral connection between an active device (for example, a source or drain area of a transistor) and an interconnect rail. The local interconnect is located at the front side of the IC, where it is at least partially embedded in the pre-metal dielectric layer between the FEOL and the BEOL. The BEOL portion defines the front side of the integrated circuit. Therefore, the PDN and the power and reference terminals are located on the backside of the IC according to the disclosed technology.

A problem with the proposed solution is that, when a carrier wafer is used with a first built-in device for attachment to a wafer of a second device with a future back side power delivery network (BSPDN), the proposed solution does not address how to access I/O and power terminals from the BSPND side of the wafer of the second device to the BEOL side of the first built-in device.

Turning now to an overview of the aspects of the invention, one or more embodiments of the invention address the above-described shortcomings of the prior art by providing a method of assembling an IC that provides for power and I/O connections when a carrier wafer with a built-in device is bonded with another wafer with a BSPND.

The above-described aspects of the invention address the shortcomings of the prior art by providing an integrated circuit (IC) assembly method. The method includes fabricating a first wafer including a first device with a back end of line (BEOL) and first terminals of first and second types at the BEOL and fabricating a second wafer. The second wafer includes a second device for back side power delivery network (BSPDN) processing, second terminals of the first type, first vias and second vias. The method further includes bonding the first and second wafers at the BEOL to connect the second terminals of the first type to a subset of the first terminals of the first type, the first vias to remaining first terminals of the first type and the second vias to the first terminals of the second type. A BSPDN is built onto a backside of the second wafer to include first and second BSPDN terminals connected to the first and second vias, respectively.

Turning now to a more detailed description of aspects of the present invention, FIG. 1 depicts an integrated circuit (IC) 101. The IC 101 includes a first wafer 110 and a second wafer 120. The first wafer 110 includes interlayer dielectric (ILD) surrounding a first device 111 with a back end of line (BEOL) 112, first terminals of a first type 113 at the BEOL 112 and first terminals of a second type 114 at the BEOL 112. The second wafer 120 includes ILD surrounding a second device 121 for back side power delivery network (BSPDN) processing, second terminals of the first type 122, first vias 123 and second vias 124. The second wafer 120 is Cu—Cu bonded to the first wafer 110 at the BEOL 112 to connect the second terminals of the first type 122 to a subset 113$_1$ of the first terminals of the first type 113, to connect the first vias 123 to remaining 113$_2$ first terminals of the first type 113 and to connect the second vias 124 to the first terminals of the second type 114. A BSPDN 130 partially formed of backside ILD (BILD) is built onto a backside 125 of the second wafer 120 to include first BSPDN terminals 131 and second BSPDN terminals 132. The first BSPDN terminals are connected to the first vias 123 by continuous build processing. The second BSPDN terminals 132 are connected to the second vias 124 by continuous build processing.

The first wafer 110 can include or be provided as a carrier wafer 1101 that is fabricated onto a first substrate 1102 with the first device 111 including or being provided as at least one or more of a logic device, a memory device and an optical chip device. The first wafer 110 can further include metallization layers 115 that are interposed between the first terminals of the first and second types 113 and 114 and the first device 111. The second wafer 120 can include or be provided as a logic wafer 1201 with the second device 121 including or being provided as at least one or more of a logic device, a memory device and an optical chip device. The second wafer 120 can further include metallization layers 126 that are interposed between the second terminals of the first type 122 and the second device 121.

The second terminals of the first type 122 are Cu—Cu bonded to the subset $113_1$ of the first terminals of the first type 113, the first vias 123 are Cu—Cu bonded to the remaining $113_2$ first terminals of the first type 113, and the second vias 124 are Cu—Cu bonded to the first terminals of the second type 114. The first terminals of the first type 113 can include or be provided as I/O terminals and the first terminals of the second type 114 can include or be provided as power terminals. The second terminals of the first type 122 can include or be provided as I/O terminals. The first vias 123 can include or be provided as I/O vias and the second vias 124 can include or be provided as power vias.

In accordance with embodiments, one of the first vias 123 including or being provided as the I/O vias can include or be provided as an I/O terminal of the first device 111 and another of the first vias 123 including or being provided as the I/O vias can include or be provided as an I/O terminal of the second device 121. In addition, one or more of the first vias 123 including or being provided as the I/O vias can be provided as plural vias and, in some cases, can be provided as plural cascaded vias. In accordance with additional or alternative embodiments, the second vias 124 including or being provided as the power vias can be shared between the first device 111 and the second device 121.

Figure 2:
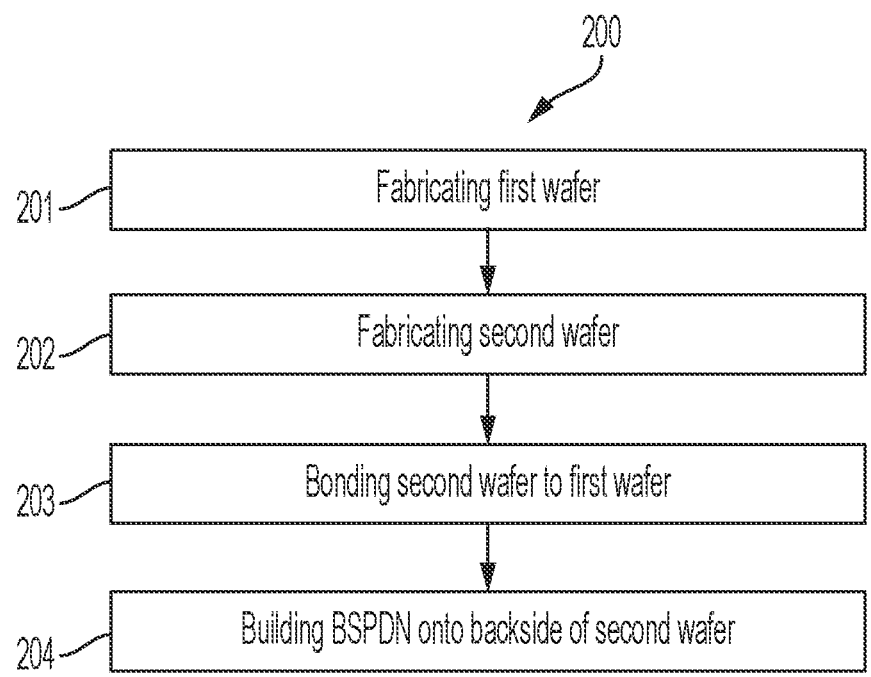
FIG. 2 is a flow diagram illustrating an integrated circuit (IC) assembly method in accordance with one or more embodiments of the present invention.

With reference to FIG. 2, an integrated circuit (IC) assembly method 200 is provided for assembling the IC of FIG. 1 for example. As shown in FIG. 2, the method 200 includes fabricating a first wafer including a first device with a back end of line (BEOL) and first terminals of first and second types at the BEOL at block 201 and fabricating a second wafer including a second device with a back end of line (BEOL) for back side power delivery network (BSPDN) processing, second terminals of the first type, first vias and second vias at block 202. The method 200 further includes bonding the first and second wafers at the BEOL by Cu—Cu bonding at block 203 to connect the second terminals of the first type to a subset of the first terminals of the first type, to connect the first vias to remaining first terminals of the first type and to connect the second vias to the first terminals of the second type. In addition, the method 200 includes building a BSPDN onto a backside of the second wafer at block 204 to include first and second BSPDN terminals connected to the first and second vias, respectively.

The fabricating of the first wafer at block 201 can include fabricating a carrier wafer onto a first substrate with the first device including or being provided as at least one or more of a logic device, a memory device and an optical chip device. The fabricating of the first wafer at block 201 can further include interposing metallization layers between the first terminals of the first and second types and the at least one or more of a logic device, a memory device and an optical chip device. The fabricating of the second wafer at block 202 can include fabricating a logic wafer onto a second substrate with the second device including or being provided as at least one or more of a logic device, a memory device and an optical chip device. The fabricating of the second wafer at block 202 can further include interposing metallization layers between the second terminals of the first type and the at least one or more of a logic device, a memory device and an optical chip device. In addition, the fabricating of the second wafer at block 202 can be executed such that the second wafer includes an etch stop layer interposed between a semiconductor layer and an additional substrate layer. The bonding at block 203 can include flipping the logic wafer. The bonding at block 203 can also include Cu—Cu bonding of the second terminals of the first type to the subset of the first terminals of the first type, Cu—Cu bonding the first vias to the remaining first terminals of the first type and Cu—Cu bonding the second vias to the first terminals of the second type.

In addition, the method 200 can include sequential removal of the additional substrate layer by wafer grinding, chemical mechanical polishing (CMP) and selective etching that stops at the etch stop layer, which is followed by removal of the etch stop layer and subsequent removal of the semiconductor layer.

As noted above, the first terminals of the first type can include or be provided as I/O terminals and the first terminals of the second type can include or be provided as power terminals. The second terminals of the first type can include or be provided as I/O terminals. The first vias can include or be provided as I/O vias and the second vias can include or be provided as power vias. Also, in accordance with embodiments, one of the first vias including or being provided as the I/O vias can include or be provided as an I/O terminal of the first device and another of the first vias including or being provided as the I/O vias can include or be provided as an I/O terminal of the second device. In addition, one or more of the first vias including or being provided as the I/O vias can be provided as plural vias and, in some cases, can be provided as plural cascaded vias. In accordance with additional or alternative embodiments, the second vias including or being provided as the power vias can be shared between the first device and the second device.

With reference back to FIGS. 1 and 2 and with additional reference to FIGS. 3-6, the method 200 of FIG. 2 will now be described in further detail to illustrate how the method 200 can lead to an assembly of the IC 101 of FIG. 1.

Figure 3:
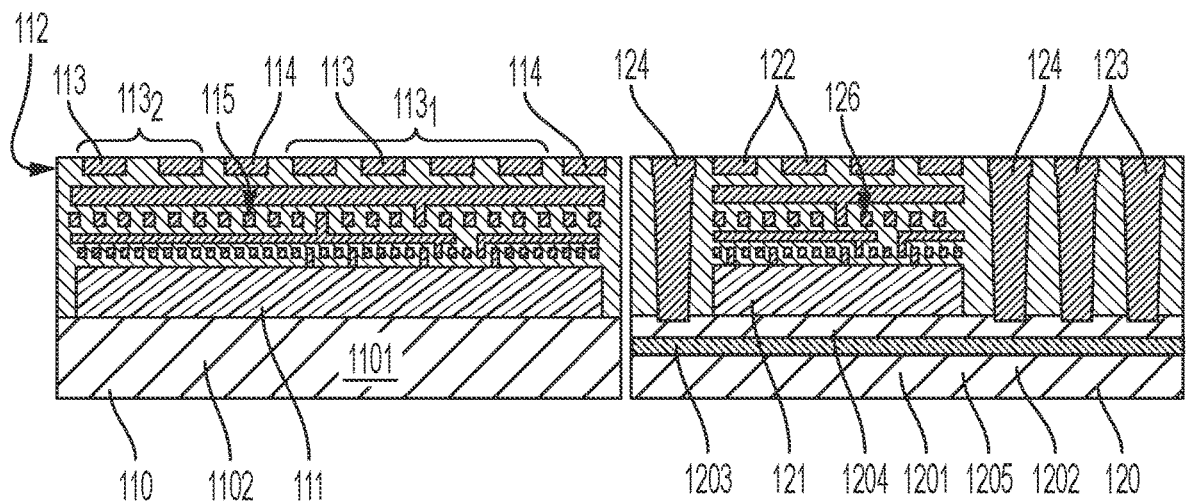
FIG. 3 depicts a first stage of the IC assembly method of FIG. 2 in accordance with one or more embodiments of the present invention.

As shown in FIG. 3, the first wafer 110 and the second wafer 120 are fabricated. The first wafer 110 includes ILD surrounding the first device 111 with the BEOL 112, the first terminals of the first type 113 at the BEOL 112 and the first terminals of the second type 114 at the BEOL 112. The second wafer 120 includes ILD surrounding the second device 121 for back side power delivery network (BSPDN) processing, the second terminals of the first type 122, the first vias 123 and the second vias 124.

The first wafer 110 can include or be provided as the carrier wafer 1101 that is fabricated onto a first substrate 1102 with the first device 111 including or being provided as at least one or more of a logic device, a memory device and an optical chip device. The first wafer 110 can further include metallization layers 115 that are interposed between the first terminals of the first and second types 113 and 114 and the first device 111. The second wafer 120 can include or be provided as a logic wafer 1201 that is fabricated onto a second substrate 1202 including the etch stop layer 1203 being interposed between a semiconductor layer 1204 and an additional substrate layer 1205 with the second device 121 including or being provided as at least one or more of a logic device, a memory device and an optical chip device. The second wafer 120 can further include metallization layers 126 that are interposed between the second terminals of the first type 122 and the second device 121.

Figure 4:
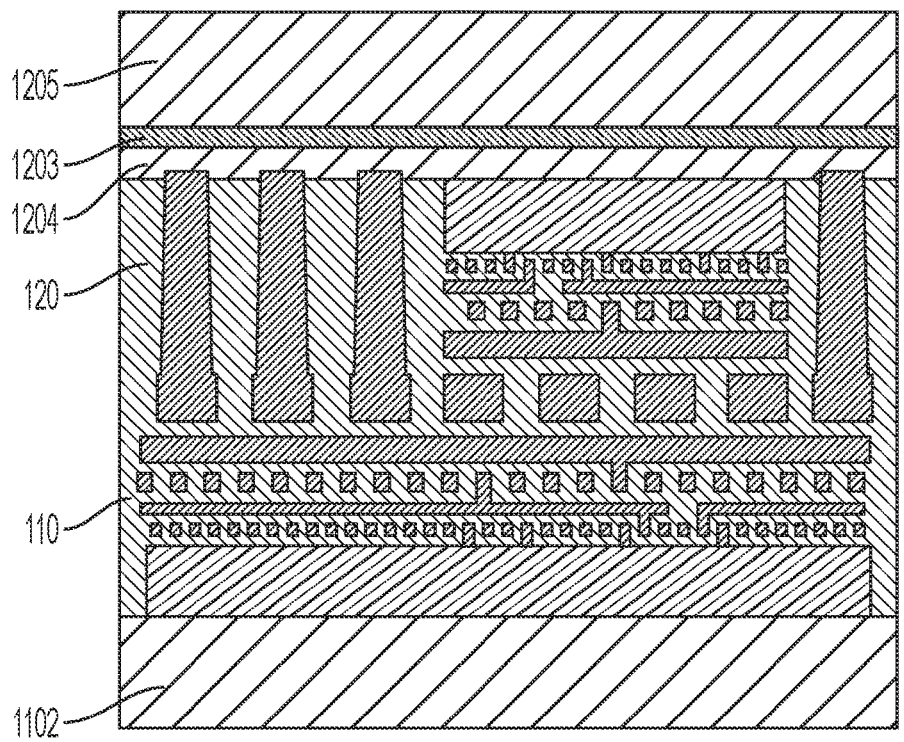
FIG. 4 depicts a second stage of the IC assembly method of FIG. 2 in accordance with one or more embodiments of the present invention.

As shown in FIG. 4, the second wafer 120 is flipped over and bonded to the first wafer 110 at the BEOL 112 to connect the second terminals of the first type 122 to the subset $113_1$ of the first terminals of the first type 113 (see FIG. 3), to connect the first vias 123 to the remaining $113_2$ first terminals of the first type 113 (see FIG. 3) and to connect the second vias 124 to the first terminals of the second type 114 (see FIG. 3).

The second terminals of the first type 122 are Cu—Cu bonded to the subset $113_1$ of the first terminals of the first type 113, the first vias 123 are Cu—Cu bonded to the remaining $113_2$ first terminals of the first type 113, and the second vias 124 are Cu—Cu bonded to the first terminals of the second type 114. The first terminals of the first type 113 can include or be provided as I/O terminals and the first terminals of the second type 114 can include or be provided as power terminals. The second terminals of the first type 122 can include or be provided as I/O terminals. The first vias 123 can include or be provided as I/O vias and the second vias 124 can include or be provided as power vias.

Figure 6:
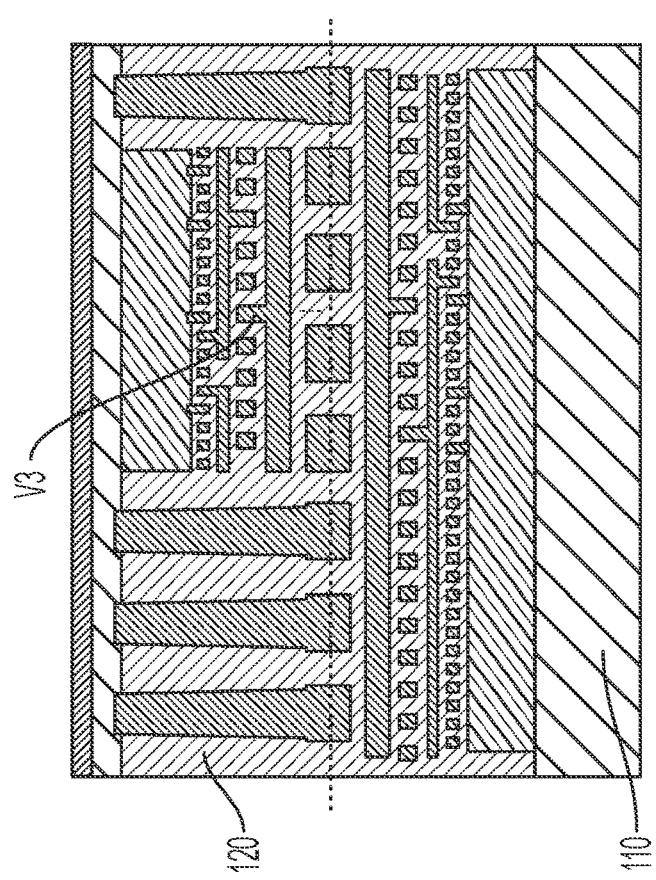
FIG. 6 depicts a fourth stage of the IC assembly method of FIG. 2 in accordance with one or more embodiments of the present invention.
Figure 5:
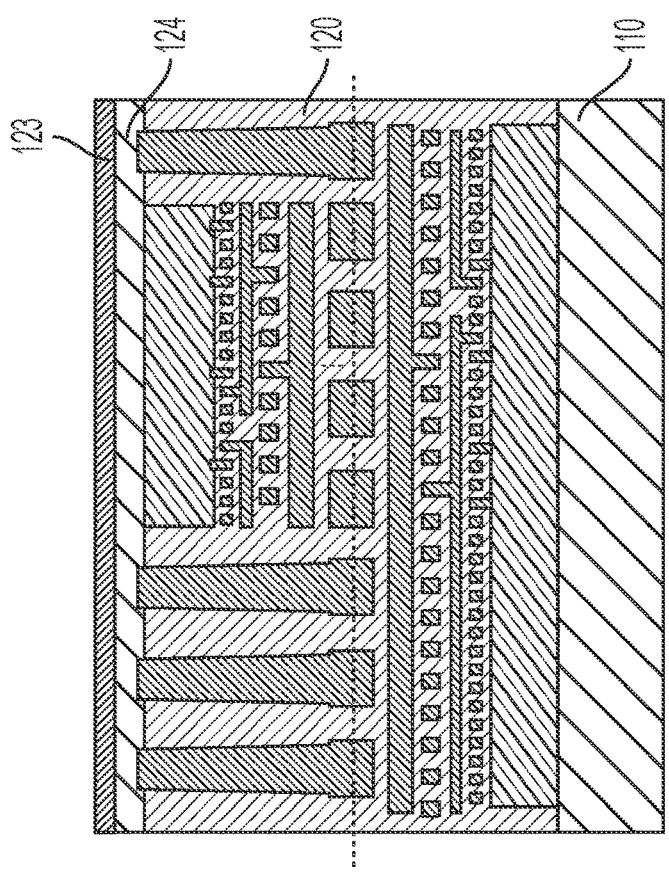
FIG. 5 depicts a third stage of the IC assembly method of FIG. 2 in accordance with one or more embodiments of the present invention.

As shown in FIGS. 5 and 6, the additional substrate layer 1205 is removed by wafer grinding, chemical mechanical polishing (CMP) and selective etching that stops at the etch stop layer (see FIG. 5) with the etch stop layer and the semiconductor layer removed thereafter (see FIG. 6).

Next, as shown in FIG. 1, the BSPDN 130 that is partially formed of the BILD is built onto the backside 125 of the second wafer 120 to include the first BSPDN terminals 131 and the second BSPDN terminals 132. The first BSPDN terminals are connected to the first vias 123. The second BSPDN terminals 132 are connected to the second vias 124.

In accordance with embodiments, one of the first vias 123 including or being provided as the I/O vias can include or be provided as an I/O terminal of the first device 111 and the another of the first vias 123 including or being provided as the I/O vias can include or be provided as an I/O terminal of the second device 121. In addition, one or more of the first vias 123 including or being provided as the I/O vias can be provided as plural vias and, in some cases, can be provided as plural cascaded vias. In accordance with additional or alternative embodiments, the second vias 124 including or being provided as the power vias can be shared between the first device 111 and the second device 121.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An integrated circuit (IC) assembly method, comprising:
fabricating a first wafer comprising a first device with a back end of line (BEOL) and first terminals of first and second types at the BEOL;
fabricating a second wafer comprising a second device for back side power delivery network (BSPDN) processing, second terminals of the first type, first vias and second vias;
bonding the first and second wafers at the BEOL to connect:
the second terminals of the first type to a subset of the first terminals of the first type,
the first vias to remaining first terminals of the first type, and
the second vias to the first terminals of the second type; and
building a BSPDN onto a backside of the second wafer to include first and second BSPDN terminals connected to the first and second vias, respectively.

2. The method according to claim 1, wherein:
the fabricating of the first wafer comprises fabricating a carrier wafer onto a first substrate, and
the fabricating of the second wafer comprises fabricating a logic wafer onto a second substrate comprising an etch stop layer interposed between a semiconductor layer and an additional substrate layer.

3. The method according to claim 2, wherein the bonding comprises:
   flipping the logic wafer; and
   Cu—Cu bonding of the second terminals of the first type to the subset of the first terminals of the first type, the first vias to the remaining first terminals of the first type, and the second vias to the first terminals of the second type.

4. The method according to claim 2, wherein:
   the first device comprises at least one or more of a logic device, a memory device and an optical chip device, and
   the second device comprises at least one or more of a logic device, a memory device and an optical chip device.

5. The method according to claim 4, wherein:
   the fabricating of the first wafer further comprises interposing metallization layers between the first terminals of the first and second types and the at least one of the memory device and the optical chip device, and
   the fabricating of the second wafer further comprises interposing metallization layers between the second terminals of the first type and the logic device.

6. The method according to claim 4, wherein:
   the first terminals of the first type comprise input/output (I/O) terminals and the first terminals of the second type comprise power terminals,
   the second terminals of the first type comprise I/O terminals,
   the first vias comprise I/O vias, and
   the second vias comprise power vias.

7. The method according to claim 6, wherein one of the I/O vias comprises an I/O terminal of the first device and another of the I/O vias comprises an I/O terminal of the second device.

8. The method according to claim 6, wherein one or more of the I/O vias is cascaded.

9. The method according to claim 6, wherein the power vias are shared between the first device and the second device.

10. An integrated circuit (IC), comprising:
    a first wafer comprising a first device with a back end of line (BEOL) and first terminals of first and second types at the BEOL;
    a second wafer comprising a second device for back side power delivery network (BSPDN) processing, second terminals of the first type, first vias and second vias, the second wafer being bonded to the first wafer at the BEOL to connect:
       the second terminals of the first type to a subset of the first terminals of the first type,
       the first vias to remaining first terminals of the first type, and
       the second vias to the first terminals of the second type; and
    a BSPDN built onto a backside of the second wafer to include first and second BSPDN terminals connected to the first and second vias, respectively.

11. The IC according to claim 10, wherein the first wafer comprises a carrier wafer fabricated onto a first substrate and the second wafer comprises a logic wafer.

12. The IC according to claim 11, wherein:
    the second terminals of the first type are Cu—Cu bonded to the subset of the first terminals of the first type,
    the first vias are Cu—Cu bonded to the remaining first terminals of the first type, and
    the second vias are Cu—Cu bonded to the first terminals of the second type.

13. The IC according to claim 11, wherein:
    the first device comprises at least one or more of a logic device, a memory device and an optical chip device, and
    the second device comprises at least one or more of a logic device, a memory device and an optical chip device.

14. The IC according to claim 13, wherein:
    the first wafer further comprises metallization layers interposed between the first terminals of the first and second types and the at least one or more of the logic device, the memory device and the optical chip device, and
    the second wafer further comprises metallization layers interposed between the second terminals of the first type and the at least one or more of the logic device, the memory device and the optical chip device.

15. The IC according to claim 13, wherein:
    the first terminals of the first type comprise input/output (I/O) terminals and the first terminals of the second type comprise power terminals,
    the second terminals of the first type comprise I/O terminals,
    the first vias comprise I/O vias, and
    the second vias comprise power vias.

16. The IC according to claim 15, wherein one of the I/O vias comprises an I/O terminal of the first device and another of the I/O vias comprises an I/O terminal of the second device.

17. The IC according to claim 15, wherein one or more of the I/O vias is cascaded.

18. The IC according to claim 15, wherein the power vias are shared between the at least one or more of the logic device, the memory device and the optical chip device of the first wafer and the at least one or more of the logic device, the memory device and the optical chip device of the second wafer.

19. An integrated circuit (IC), comprising:
    a carrier wafer comprising at least one or more of a logic device, a memory device and an optical chip device with a back end of line (BEOL), and first input/output (I/O) terminals and first power terminals at the BEOL;
    a second wafer comprising at least one or more of a logic device, a memory device and an optical chip device for back side power delivery network (BSPDN) processing, second I/O terminals, I/O vias and power vias, the second wafer being bonded to the carrier wafer at the BEOL to connect:
       the second I/O terminals to a subset of the first I/O terminals,
       the I/O vias to remaining first I/O terminals, and
       the power vias to the first power terminals; and
    a BSPDN built onto a backside of the second wafer to include first and second BSPDN terminals connected to the I/O and the power vias, respectively.

20. The IC according to claim 19, wherein the power vias are shared between the at least one or more of the logic device, the memory device and the optical chip device of the carrier wafer and the at least one or more of the logic device, the memory device and the optical chip device of the second wafer.

* * * * *